(12) United States Patent
You

(10) Patent No.: US 9,963,590 B2
(45) Date of Patent: May 8, 2018

(54) HALOGEN-FREE RESIN COMPOSITION, AND A PREPREG AND A LAMINATE USED FOR PRINTED CIRCUIT USING THE SAME

(71) Applicant: SHENGYI TECHNOLOGY CO., LTD., Dongguan (CN)

(72) Inventor: Jiang You, Dongguan (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 52 days.

(21) Appl. No.: 15/027,374

(22) PCT Filed: Jun. 10, 2014

(86) PCT No.: PCT/CN2014/079567
§ 371 (c)(1),
(2) Date: Apr. 5, 2016

(87) PCT Pub. No.: WO2015/188310
PCT Pub. Date: Dec. 17, 2015

(65) Prior Publication Data
US 2016/0244602 A1    Aug. 25, 2016

(51) Int. Cl.
| | |
|---|---|
| *C08L 63/00* | (2006.01) |
| *C08G 59/50* | (2006.01) |
| *C08J 5/24* | (2006.01) |
| *C08L 79/02* | (2006.01) |
| *H05K 1/03* | (2006.01) |
| *B32B 27/38* | (2006.01) |
| *B32B 27/42* | (2006.01) |
| *C08K 3/22* | (2006.01) |
| *C08K 3/34* | (2006.01) |
| *C08K 3/40* | (2006.01) |
| *C08K 5/00* | (2006.01) |
| *C08L 63/04* | (2006.01) |
| *C08G 14/06* | (2006.01) |
| *C08L 61/06* | (2006.01) |
| *C08L 61/34* | (2006.01) |
| *C08G 59/32* | (2006.01) |

(Continued)

(52) U.S. Cl.
CPC ............. *C08L 63/00* (2013.01); *B32B 27/38* (2013.01); *B32B 27/42* (2013.01); *C08G 14/06* (2013.01); *C08G 59/3218* (2013.01); *C08G 59/5073* (2013.01); *C08G 59/621* (2013.01); *C08G 59/686* (2013.01); *C08J 5/24* (2013.01); *C08K 3/22* (2013.01); *C08K 3/34* (2013.01); *C08K 3/40* (2013.01); *C08K 5/0066* (2013.01); *C08L 61/06* (2013.01); *C08L 61/34* (2013.01); *C08L 63/04* (2013.01); *C08L 79/02* (2013.01); *H05K 1/0373* (2013.01); *B32B 2260/021* (2013.01); *B32B 2260/023* (2013.01); *B32B 2260/046* (2013.01); *B32B 2262/101* (2013.01); *B32B 2264/102* (2013.01); *B32B 2264/104* (2013.01); *B32B 2307/204* (2013.01); *B32B 2307/306* (2013.01); *B32B 2307/3065* (2013.01); *B32B 2307/714* (2013.01); *B32B 2307/726* (2013.01); *B32B 2307/7265* (2013.01); *B32B 2307/734* (2013.01); *B32B 2457/08* (2013.01); *C08J 2363/00* (2013.01); *C08J 2379/02* (2013.01); *C08J 2379/04* (2013.01); *C08J 2461/06* (2013.01); *C08J 2463/00* (2013.01); *C08J 2479/02* (2013.01); *C08J 2479/04* (2013.01); *C08L 2201/02* (2013.01); *C08L 2201/22* (2013.01); *C08L 2203/20* (2013.01); *C08L 2205/03* (2013.01); *H05K 2201/012* (2013.01); *H05K 2201/015* (2013.01)

(58) Field of Classification Search
CPC combination set(s) only.
See application file for complete search history.

(56) References Cited

U.S. PATENT DOCUMENTS

2013/0161080 A1    6/2013    Lin et al.

FOREIGN PATENT DOCUMENTS

| CN | 10684191 A | 3/2010 |
|---|---|---|
| CN | 101914265 A | 12/2010 |
| CN | 10781442 A | 1/2014 |

(Continued)

OTHER PUBLICATIONS

ISA/CN, International Search Report and Written Opinion prepared for PCT/CN2014/079567 dated Feb. 27, 2015.

(Continued)

*Primary Examiner* — Edward J Cain
(74) *Attorney, Agent, or Firm* — McDonald Hopkins, LLC

(57) ABSTRACT

The technology discloses a halogen-free resin composition and a prepreg and a laminate used for a printed circuit. The resin composition comprises: alkyl phenol epoxy resin; benzoxazine resin, alkyl phenol novolac curing agent, and phosphorus-containing flame retardant. The alkyl phenol epoxy resin has many alkyl branched chains in its molecular structure, making the composition have excellent dielectric properties, a higher glass transition temperature, low water absorption, and good heat resistance. Mixing benzoxazine resin into the composition can further reduce dielectric constant, dielectric loss value and water absorption of the cured product. With an alkyl phenol novolac curing agent, the molecular structure will have many alkyls, excellent dielectric properties and low water absorption. A prepreg and a laminate used for printed circuit prepared using the resin composition have low dielectric constants, dielectric loss factors, and water absorption, high dimensional stability, high thermal resistance and good flame retardancy, processability and chemical resistance.

19 Claims, No Drawings

(51) Int. Cl.
*C08G 59/62* (2006.01)
*C08G 59/68* (2006.01)

(56) References Cited

FOREIGN PATENT DOCUMENTS

| | | |
|---|---|---|
| CN | 103540101 A | 1/2014 |
| CN | 103834168 A | 6/2014 |
| EP | 2290009 A1 | 3/2011 |
| KR | 20030016551 A | 3/2003 |
| KR | 20140067005 A | 6/2014 |

OTHER PUBLICATIONS

Supplementary European Search Report dated Jan. 2, 2018; European Patent Application No. 14894564.5 filed Apr. 19, 2017.

HALOGEN-FREE RESIN COMPOSITION, AND A PREPREG AND A LAMINATE USED FOR PRINTED CIRCUIT USING THE SAME

CROSS REFERENCE TO RELATED APPLICATIONS

This application is a 35 U.S.C. 371 national stage filing and claims priority to International Application No. PCT/CN2014/079567 filed on Jun. 10, 2014, entitled "A HALOGEN-FREE RESIN COMPOSITION, AND A PREPREG AND A LAMINATE USED FOR PRINTED CIRCUIT USING THE SAME," which is incorporated herein by reference in its entirety.

BRIEF SUMMARY OF THE INVENTION

The present invention relates to a halogen-free resin composition, and a prepreg and a laminate which are prepared by using the same and have advantages of low dielectric constant, low dielectric loss factor, low water absorption, high dimensional stability, high thermal resistance and good flame retardancy, processability and chemical resistance, etc.

BACKGROUND OF THE INVENTION

Traditional laminates used for printed circuit mainly utilize brominated flame retardants to achieve flame retardancy, in particular utilize tetrabromobisphenol-A epoxy resin which has good flame retardancy but can produce hydrogen bromide gas when burning. In addition, in recent years, carcinogens such as dioxins, dibenzofurans and others have been detected in the combustion products of wastes of electrical and electronic equipments containing halogen such as bromine, chlorine and the like, and thus the use of brominated epoxy resin is limited. On Jul. 1, 2006, two environmental protection directives of the European Union, "Directive on the Waste Electrical and Electronic Equipment" and "Directive on the Restriction of the Use of Certain Hazardous Substances in Electrical and Electronic Equipment" were officially implemented. The development of halogen-free flame retardant copper-clad laminates has become a hot topic in the related industry field, and each copper-clad laminate manufacturer has launched their own halogen-free flame retardant copper-clad laminate in succession.

With the development of high-speed and multi-functionalization of information processing of electronic products, the frequency applied is increasing. In addition to a higher demand for thermal resistance of laminate materials, there is also a demand that the dielectric constant and the dielectric loss value become lower and lower, and thus reducing Dk/Df has become a hot topic pursued by the practitioners in substrate industry. Traditional FR-4 materials mainly utilize dicyandiamide as a curing agent. This curing agent has a reactive tertiary amine and has good processing operability, but since its C—N bond is weak and easy to crack at a high temperature, resulting in a lower thermal decomposition temperature for the cured product, it cannot meet the demand for thermal resistance during the lead-free manufacturing process. In this background, with the wide implementation of the lead-free technology in 2006, phenolic resin began to be used as an epoxy curing agent in the industry. Phenolic resin has benzene ring structures with high density, and thus the thermal resistance of a cured system of phenolic resin and epoxy resin is excellent, but the dielectric properties of the cured product have a trend of being worse.

CN 101914265A discloses a halogen-free phosphorus-containing flame retardant high-frequency epoxy resin composition. In the resin composition of the invention, conventional brominated difunctional epoxy resin is substituted by multifunctional epoxy resin; conventional dicyandiamide is substituted by linear phenolic resin serving as a curing agent. The epoxy resin composition consists of benzoxazine epoxy resin, tetraphenol ethane epoxy resin, DOPO modified phenolic resin, alkyl modified phenolic resin, imidazole accelerating agent, inorganic filler, inorganic auxiliary flame retardant filler and the like. The bonding sheet and the copper-clad plate, which are prepared from the epoxy resin composition and are used for a printed circuit board, have environmentally-friendly flame retardancy and excellent dielectric performance. But the bonding sheet and the copper-clad laminate have a water absorption being up to 0.3%-0.4%, and thus can absorb moisture easily resulting in delamination in the subsequent process for preparing PCB, and the dielectric properties thereof are common, therefore it is difficult to meet the requirements for development of high frequency in electronic signal transmission and high-speed in information processing in the industry of printed circuit copper clad laminate.

DETAILED DESCRIPTION OF THE INVENTION

In view of the problems existing in the prior art, the purpose of the present invention lie in providing a novel, halogen-free, low dielectric resin composition, and a prepreg and a laminate prepared by using the same. The laminate used for printed circuit prepared by using the resin composition has low dielectric constant, low dielectric loss factor, low water absorption, high dimensional stability, high thermal resistance and good flame retardancy, processability and chemical resistance, etc.

In order to achieve the above purposes, the present inventors carried out repeated and in-depth research and found that a composition obtained by appropriately mixing alkyl phenol epoxy resin with benzoxazine resin, alkyl phenol novolac curing agent, phosphorus-containing flame retardant and other optional components can achieve the purposes.

A halogen-free resin composition comprising the following components:
(A) alkyl phenol epoxy resin;
(B) benzoxazine resin;
(C) alkyl phenol novolac curing agent; and
(D) phosphorus-containing flame retardant.

The alkyl phenol epoxy resin used in the present invention has many alkyl branched chains in its molecular structure, making the composition have excellent dielectric properties while it has a higher glass transition temperature, low water absorption, and good heat resistance. Mixing benzoxazine resin into the composition can further reduce the dielectric constant, dielectric loss value, and water absorption of the cured product. With alkyl phenol novolac being used as a curing agent, molecular structure has the benefit of many alkyls and thus the dielectric properties are excellent and the water absorption is low.

The present invention obtained the above halogen-free low dielectric resin composition by utilizing the mutual cooperation and synergistic interaction of the above three necessary components and by adding phosphorus-containing flame retardant. The prepreg and the laminate used for printed circuit prepared by using the halogen-free low dielectric resin composition have low dielectric constant, low dielectric loss factor, low water absorption, high dimensional stability, high thermal resistance and good flame retardancy, processability and chemical resistance.

The component (A), i.e., the alkyl phenol epoxy resin, can improve the electrical property, moisture resistance, heat resistance and mechanical property required by the cured resin and the laminate prepared by using the same. Based on 100 parts by weight of the organic solid matters, the addition amount of the alkyl phenol epoxy resin is 10-50 parts by weight, for example 13 parts by weight, 16 parts by weight, 19 parts by weight, 22 parts by weight, 25 parts by weight, 28 parts by weight, 31 parts by weight, 34 parts by weight, 37 parts by weight, 40 parts by weight, 43 parts by weight, 46 parts by weight or 49 parts by weight, and preferably 20-50 parts by weight.

In the present invention, the alkyl phenol epoxy resin having the above addition amount can not only obviously improve the dielectric properties of the cured products but also keep a higher adhesion force.

Preferably, the alkyl phenol epoxy resin has the following structure:

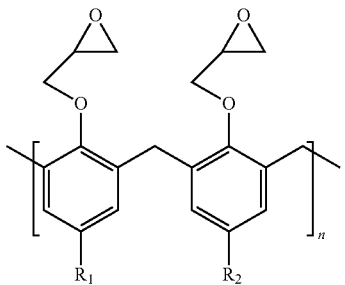

wherein, $R_1$ and $R_2$ are independently substituted or unsubstituted straight alkyl or branched alkyl having a carbon atom number of 4-8, preferably n-butyl or n-octyl; n is an integer between 2-20, for example 3, 4, 5, 6, 7, 8, 9, 10, 11, 12, 13, 14, 15, 16, 17, 18 or 19.

In the present invention, n-butyl or n-octyl has a regular structure, and thus the dielectric properties and heat resistance thereof are good.

Preferably, based on 100 parts by weight of the organic solid matters, the addition amount of the benzoxazine resin is 10-70 parts by weight, for example 13 parts by weight, 16 parts by weight, 19 parts by weight, 22 parts by weight, 25 parts by weight, 28 parts by weight, 31 parts by weight, 34 parts by weight, 37 parts by weight, 40 parts by weight, 43 parts by weight, 46 parts by weight, 49 parts by weight, 52 parts by weight, 55 parts by weight, 58 parts by weight, 61 parts by weight, 64 parts by weight, 67 parts by weight or 69 parts by weight.

In the present invention, benzoxazine resin having the above addition amount can improve the heat resistance and the rigidity of the cured products and can reduce water absorption.

Preferably, the benzoxazine resin is any one of bisphenol-A benzoxazine resin, bisphenol-F benzoxazine resin, MDA (4,4'-diaminodiphenylmethan) benzoxazine resin, phenolphthalein benzoxazine resin or dicyclopentadiene benzoxazine resin, or a mixture of at least two or more thereof. Said mixture is for example a mixture of bisphenol-A benzoxazine resin and bisphenol-F benzoxazine resin, a mixture of MDA benzoxazine resin and phenolphthalein benzoxazine resin, a mixture of dicyclopentadiene benzoxazine resin and bisphenol-A benzoxazine resin, a mixture of bisphenol-F benzoxazine resin, MDA benzoxazine resin, phenolphthalein benzoxazine resin and dicyclopentadiene benzoxazine resin.

Preferably, based on 100 parts by weight of the organic solid matters, the addition amount of the alkyl phenol novolac curing agent is 5-25 parts by weight, for example 6 parts by weight, 8 parts by weight, 10 parts by weight, 12 parts by weight, 14 parts by weight, 16 parts by weight, 18 parts by weight, 20 parts by weight, 22 parts by weight or 24 parts by weight.

In the present invention, alkyl phenol novolac curing agent having the above addition amount can improve dielectric properties of the cured products and also can keep higher adhesion force.

Preferably, the alkyl phenol novolac curing agent has the following structure:

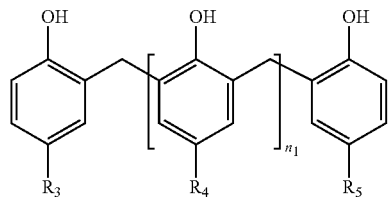

wherein, $R_3$, $R_4$ and $R_5$ are independently substituted or unsubstituted straight alkyl or branched alkyl having a carbon atom number of 4-8, preferably n-butyl or n-octyl; $n_1$ is an integer between 2-20, for example 3, 4, 5, 6, 7, 8, 9, 10, 11, 12, 13, 14, 15, 16, 17, 18 or 19.

The addition of phosphorus-containing flame retardant makes the resin composition have a flame retardant property and meet the requirements of UL 94V-0. Meanwhile, benzoxazine resin has a synergistic flame retardant effect with phosphorus-containing flame retardant, reducing the phosphorus content of the cured product required to achieve UL 94V-0 for flame retardancy, further reducing the water absorption. Preferably, based on 100 parts by weight of the total addition amount of component (A), component (B) and component (C), the addition amount of the phosphorus-containing flame retardant is 5-50 parts by weight, for example 7 parts by weight, 9 parts by weight, 11 parts by weight, 13 parts by weight, 16 parts by weight, 19 parts by weight, 22 parts by weight, 25 parts by weight, 28 parts by weight, 31 parts by weight, 34 parts by weight, 37 parts by weight, 40 parts by weight, 43 parts by weight, 46 parts by weight, or 49 parts by weight.

Preferably, the phosphorus-containing flame retardant is any one of tri(2,6-dimethylphenyl)phosphine, 10-(2,5-dihydroxyphenyl)-9,10-dihydro-9-oxa-10-phosphaphenanthrene-10-oxide, 2,6-bis(2,6-dimethylphenyl) phosphinobenzene or 10-phenyl-9,10-dihydro-9-oxa-10-phosphaphenanthrene-10-oxide, phenoxy phosphazene compound, phosphate or polyphosphate, or a mixture of at least two or more thereof.

Preferably, the halogen-free resin composition also comprises a curing accelerator, which makes the resin cure and accelerate the curing rate of the resin. Based on 100 parts by weight of the total addition amount of component (A), component (B), component (C) and component (D), the addition amount of the curing accelerator is 0.05-1 parts by weight, for example 0.08 parts by weight, 0.1 parts by weight, 0.15 parts by weight, 0.2 parts by weight, 0.25 parts by weight, 0.3 parts by weight, 0.35 parts by weight, 0.4 parts by weight, 0.45 parts by weight, 0.5 parts by weight, 0.55 parts by weight, 0.6 parts by weight, 0.65 parts by weight, 0.7 parts by weight, 0.75 parts by weight, 0.8 parts by weight, 0.85 parts by weight, 0.9 parts by weight, or 0.95 parts by weight.

Preferably, the curing accelerator is any one selected from the group consisting of: imidazole and/or pyridine curing accelerators, or a mixture of at least two or more thereof; preferably any one selected from the group consisting of 2-methyl imidazole, 2-ethyl-4-methyl imidazole, 2-phenyl imidazole, 2-undecyl imidazole, triethylamine, benzyl dimethylamine or dimethylamino pyridine, or a mixture of at least two or more thereof.

Preferably, the halogen-free resin composition also comprises a filler. The filler is organic and/or inorganic filler, and is mainly used to adjust some physical properties of the composition, for example, to reduce thermal expansion coefficient (CTE), water absorption, and to improve thermal conductivity.

Preferably, based on 100 parts by weight of the total addition amount of component (A), component (B), component (C) and component (D), the addition amount of the filler is 0-100 parts by weight excluding 0, preferably 0-50 parts by weight excluding 0. The addition amount of the filler is for example 0.5 parts by weight, 1 parts by weight, 5 parts by weight, 10 parts by weight, 15 parts by weight, 20 parts by weight, 25 parts by weight, 30 parts by weight, 35 parts by weight, 40 parts by weight, 45 parts by weight, 50 parts by weight, 55 parts by weight, 60 parts by weight, 65 parts by weight, 70 parts by weight, 75 parts by weight, 80 parts by weight, 85 parts by weight, 90 parts by weight, or 95 parts by weight.

Preferably, the inorganic filler is any one selected from the group consisting of: fused silicon dioxide, crystalline silicon dioxide, spherical silicon dioxide, hollow silicon dioxide, aluminum hydroxide, alumina, talcum powder, aluminum nitride, boron nitride, silicon carbide, barium sulfate, barium titanate, strontium titanate, calcium carbonate, calcium silicate, mica or glass fiber powder, or a mixture of at least two or more thereof. Said mixture is for example a mixture of fused silicon dioxide and crystalline silicon dioxide, a mixture of spherical silicon dioxide and hollow silicon dioxide, a mixture of aluminum hydroxide and alumina, a mixture of talcum powder and aluminum nitride, a mixture of boron nitride and silicon carbide, a mixture of barium sulfate and barium titanate, a mixture of strontium titanate and calcium carbonate, a mixture of calcium silicate, mica and glass fiber powder, a mixture of fused silicon dioxide, crystalline silicon dioxide and spherical silicon dioxide, a mixture of hollow silicon dioxide, aluminum hydroxide and alumina, a mixture of talcum powder, aluminum nitride and boron nitride, a mixture of silicon carbide, barium sulfate and barium titanate, a mixture of strontium titanate, calcium carbonate, calcium silicate, mica, and glass fiber powder.

Preferably, the organic filler is any one selected from the group consisting of polytetrafluorethylene powder, polyphenylene sulfide or polyethersulfone powder, or mixture of at least two or more thereof. Said mixture is, e.g., a mixture of polytetrafluorethylene powder and polyphenylene sulfide, a mixture of polyethersulfone powder and polytetrafluorethylene powder, a mixture of polyphenylene sulfide and polyethersulfone powder, a mixture of polytetrafluorethylene powder, polyphenylene sulfide, and polyethersulfone powder.

Preferably, the filler is silicon dioxide, and the median of the particle diameter thereof is 1-15 μm, and preferably 1-10 μm. The filler with a particle size falling into this range has a good dispersion.

The term "comprise(s)/comprising" used in the present invention means that in addition to the components described, other components which give the halogen-free resin composition different characteristics can also be included. In addition, the term "comprise(s)/comprising" used in the present invention may also be replaced by a closed description as "is/being" or "consist(s) of/consisting of."

For example, the halogen-free resin composition may also comprise a variety of additives, and as specific examples, an antioxidant, heat stabilizer, antistatic agent, UV absorber, pigment, coloring agent, or lubricant and others may be listed. These additives may be used alone, and may also be used in the form of a mixture of two or more of thereof.

A conventional method for preparing the halogen-free resin composition of the present invention is: firstly adding solid matters, and then adding a liquid solvent, stirring until the solid matters are completely dissolved, then adding a liquid resin and a curing accelerator, and continuing to stir until the mixture is homogeneous, and finally adjusting the solid content of the solution to 65%-75% by using a solvent to obtain a varnish.

The second purpose of the present invention is to provide a prepreg comprising a reinforcing material and the halogen-free resin composition as mentioned above which is attached on the reinforcing material after impregnation and drying.

Exemplary reinforcing materials are nonwoven fabrics and/or other fabrics, for example, natural fibers, organic synthetic fibers, and inorganic fibers.

The varnish is used to impregnate reinforcing materials for example fabrics such as glass cloth and the like or organic fabrics. The impregnated reinforcing material is dried in an oven at 155° C. for 5-10 min to obtain a prepreg.

The third purpose of the present invention is to provide a laminate comprising at least one sheet of the prepreg as mentioned above.

The fourth purpose of the present invention is to provide a metal-clad laminate comprising at least one sheet of the prepreg as mentioned above and metal foils overlapped on one or two sides of the superimposed prepreg, and it is made by heating, pressing, and molding.

The metal-clad laminate is obtained by the following steps: 10 sheets of prepregs mentioned above and 2 sheets of metal foils each of which has a thickness of 1 ounce (35 μm thick) are superimposed together, and are laminated through a hot press machine and thus are pressed into metal-clad laminate. Said lamination should meet the following requirements: 1. the temperature rising rate for the lamination is usually controlled at 1.5-2.5° C./min when the temperature of the materials is 80-220° C.; 2. the pressure conducted for the lamination is a full pressure which is about 350 psi when the temperature of the outer materials is 120-150° C.; 3. when curing, the temperature of the materials is controlled at 190° C. and the temperature is kept for 90 min. The metal foil is a copper foil, a nickel foil, an aluminum foil and a SUS foil, etc., and the material of the metal foil is not limited.

Compared with the prior arts, the present invention has the following beneficial effects:
1) The halogen-free low dielectric resin composition of the present invention uses alkyl phenol epoxy resin as one component; said epoxy resin has excellent dielectric properties in addition to advantages of high glass transition temperature, low water absorption, good heat resistance and others; 2) Mixing benzoxazine resin into the composition can further reduce dielectric constant, dielectric loss value and water absorption of the cured product; in addition, benzoxazine resin and phosphorus-containing flame retardant have a synergistic flame retardant effect, reducing the phosphorus content of the cured product required to achieve UL 94V-0 for flame retardancy, further reducing the water absorption; 3) The halogen-free low dielectric resin composition of the present invention uses alkyl phenol novolac as a curing agent, and the advantages that the molecular structure thereof has many alkyls and thus the dielectric properties are excellent and the water absorption is low; 4) the prepreg and the laminate used for printed circuit prepared by using the resin composition have advantages of low dielectric constant, low dielectric loss factor, low water absorption, high thermal resistance, high dimensional stability and good flame retardancy, processability, and chemical resistance.

Examples

Hereinafter, the technical solutions of the present application are further described by the specific examples.

With respect to the laminate (10 sheets of prepregs) used for printed circuit prepared above, the properties of glass transition temperature, dielectric constant, dielectric loss factor, bending strength, water absorption, heat resistance, flame resistance, and others thereof are tested.

The examples of the present invention are described in detail as follows, but the present invention is not limited to these examples. In the following, the "parts" means "parts by weight", and the "%" means "% by weight", unless otherwise noted.

(A) epoxy resin
(A-1) alkyl phenol epoxy resin
KES-7595 (trade name: KOLON, Korea)
(A-2) bisphenol-A novolac epoxy resin
EPR627MEK80 (trade name: Hexion, US)
(B) benzoxazine resin
LZ 8290H62 (trade name: HUNTSMAN)
(C) curing agent
(C-1) alkyl phenol novolac curing agent
KPT-F1350E (trade name: KOLON, Korea)
(C-2) linear novolac curing agent
2812 (trade name: MOMENTIVE, Korea)
(D) phosphorus-containing flame retardant
DOW XZ92741 (trade name: DOW, US)
(E) 2-phenyl imidazole (Shikoku chemicals corporation, Japan)
(F) filler
spherical silica powder (the average particle size thereof is 1 to 10 μm, and the purity thereof is more than 99%)

TABLE 1

Formulas and Physical Data for Each Example and Comparative Example

|  | Example 1 | Example 2 | Example 3 | Example 4 | Example 5 |
|---|---|---|---|---|---|
| A-1 | 50 | 40 | 30 | 20 | 10 |
| A-2 | — | — | — | — | — |
| B | 10 | 25 | 40 | 55 | 70 |
| C-1 | 25 | 20 | 15 | 10 | 5 |
| C-2 | — | — | — | — | — |
| D | 15 | 15 | 15 | 35 | 5 |
| E | appropriate amount | appropriate amount | appropriate amount | appropriate amount | appropriate amount |
| F | 40 | 40 | 40 | 40 | 40 |
| glass transition temperature(DSC)° C. | 172 | 164 | 166 | 158 | 175 |
| dielectric constant(1 GHz) | 3.55 | 3.57 | 3.61 | 3.60 | 3.67 |
| dielectric loss(1 GHz) | 0.0088 | 0.0085 | 0.0092 | 0.0090 | 0.0098 |
| bending strength (N/mm$^2$) | 504 | 532 | 551 | 575 | 578 |
| water absorption (%) | 0.08 | 0.07 | 0.06 | 0.06 | 0.06 |
| dip soldering resistance 288° C., s | >120 | >120 | >120 | >120 | >120 |
| flame retardancy | V-0 | V-0 | V-0 | V-0 | V-0 |

TABLE 2

Formulas and Physical Data for Each Comparative Example

|  | Comparative Example 1 | Comparative Example 2 | Comparative Example 3 |
|---|---|---|---|
| A-1 | 60 | — | 30 |
| A-2 | — | 40 | — |
| B | — | 25 | 40 |
| C-1 | 25 | 20 | — |
| C-2 | — | — | 15 |
| D | 15 | 15 | 15 |
| E | appropriate amount | appropriate amount | appropriate amount |
| F | 40 | 40 | 40 |
| glass transition temperature(DSC)° C. | 175 | 158 | 160 |
| dielectric constant (1 GHz) | 3.58 | 3.91 | 3.89 |
| dielectric loss (1 GHz) | 0.0095 | 0.0121 | 0.0134 |
| bending strength (N/mm2) | 425 | 512 | 521 |
| water absorption(%) | 0.12 | 0.09 | 0.08 |
| dip soldering resistance 288° C., s | 55 | >120 | >120 |
| flame retardancy | V-0 | V-0 | V-0 |

Test methods for the above characteristics are as follows:
(a) Glass Transition Temperature (Tg)
Glass transition temperature is tested according to differential scanning calorimetry (DSC) as described by IPC-TM-650 2.4.25.

(b) Dielectric Constant and Dielectric Loss Factor

Dielectric constant and dielectric loss factor are tested at 1 GHz according to the resonance method using a strip line, in accordance with IPC-TM-650 2.5.5.5.

(c) Bending Strength

Bending strength is tested according to IPC-TM-650 2.4.4 method, by applying the load on a sample having specified size and shape at room temperature.

(d) Water Absorption

Water absorption is tested according to IPC-TM-650 2.6.2.1 method.

(e) Dip Soldering Resistance

Dip soldering resistance is tested according to IPC-TM-650 2.4.13.1 by observing the time of delamination and blister.

(f) Flame Retardancy

Flame retardancy is tested according to UL 94 vertical combustion method.

From the physical data in Table 1 and Table 2, it can be seen that in Comparative Example 1, when alkyl phenol epoxy resin is cured with alkyl phenol novolac curing agent, the dielectric properties thereof are better, but the water absorption is high, the bending strength is low, and the heat resistance is poor; in Comparative Example 2, bisphenol-A novolac epoxy resin is co-cured with benzoxazine resin and alkyl phenol novolac curing agent, and in Comparative Example 3, alkyl phenol epoxy resin is co-cured with benzoxazine resin and linear novolac resin, and the cured products have poor dielectric properties, high dielectric constants, and high dielectric loss when only one of the alkyl phenol epoxy resin and the alkyl phenol novolac curing agent is present. In Examples 1-5, when alkyl phenol epoxy resin is co-cured with benzoxazine resin and alkyl phenol novolac curing agent, the obtained laminates have excellent dielectric properties, water absorption, high bending strength, and high heat resistance.

As can be known from this, only when alkyl phenol epoxy resin, benzoxazine resin and alkyl phenol novolac curing agent are present at the same time, a laminate with excellent comprehensive properties can be obtained due to the mutual synergistic effect of the three components. Comparative Examples 1-3 do not utilize benzoxazine resin, alkyl phenol epoxy resin and alkyl phenol novolac curing agent respectively, so the comprehensive properties of obtained laminates in Comparative Examples 1-3 are obviously worse than that of the laminates in the Examples 1-5.

Therefore, compared to conventional halogen-free laminates, the laminate used for printed circuit of the present invention has better dielectric properties, moisture resistance and dimensional stability, and thus is suitable for a high density interconnector field. In addition, the present invention makes full use of the synergistic characteristic of benzoxazine resin and phosphorus-containing flame retardant, and the halogen content can achieve V-0 standard in flame retardancy experiment UL94 in the range of JPCA halogen-free standard, and thus the laminate of the present invention has an environmental protection effect.

The above are only some examples of the present invention. Those skilled in the art can make a variety of other corresponding changes and modifications, and the changes and modifications all should fall into the scope of the claims of the present invention.

The present application illustrates the detailed compositions of the present invention by the above examples, but the present invention is not limited to the detailed compositions, that is, it does not mean that the invention must be conducted relying on the above detailed compositions. Those skilled in the art should understand that any modification to the present invention, any equivalent replacement of each raw material of the present invention and the addition of auxiliary ingredient, the selection of specific embodiment and the like all fall into the protection scope and the disclosure scope of the present invention.

The invention claimed is:

1. A halogen-free resin composition, comprising:
   (A) an alkyl phenol epoxy resin;
   (B) a benzoxazine resin;
   (C) an alkyl phenol novolac curing agent; and
   (D) a phosphorus-containing flame retardant.

2. The halogen-free resin composition of claim 1, wherein, based on 100 parts by weight of the organic solid matters, the addition amount of the alkyl phenol epoxy resin is about 10 to about 50 parts by weight.

3. The halogen-free resin composition of claim 1, wherein the alkyl phenol epoxy resin has the following structure:

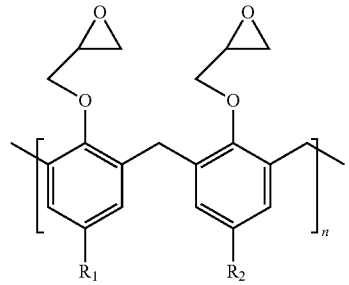

wherein, $R_1$ and $R_2$ are independently substituted or unsubstituted straight alkyl or branched alkyl having a carbon atom number of 4 to 8; and n is an integer between 2 and 20.

4. The halogen-free resin composition of claim 1, wherein based on 100 parts by weight of the organic solid matters, the addition amount of the benzoxazine resin is about 10 to about 70 parts by weight.

5. The halogen-free resin composition of claim 1, wherein the benzoxazine resin is any one of bisphenol-A benzoxazine resin, bisphenol-F benzoxazine resin, MDA benzoxazine resin, phenolphthalein benzoxazine resin or dicyclopentadiene benzoxazine resin, or a mixture of at least two thereof.

6. The halogen-free resin composition of claim 1, wherein based on 100 parts by weight of the organic solid matters, the addition amount of the alkyl phenol novolac curing agent is about 5 to about 25 parts by weight.

7. The halogen-free resin composition of claim 1, wherein the alkyl phenol novolac curing agent has the following structure:

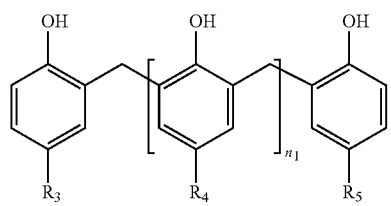

wherein, $R_3$, $R_4$ and $R_5$ are independently substituted or unsubstituted straight alkyl or branched alkyl having a carbon atom number of 4-8; and $n_1$ is an integer between 2 and 20.

8. The halogen-free resin composition of claim 1, wherein based on 100 parts by weight of the total addition amount of component (A), component (B) and component (C), the addition amount of the phosphorus-containing flame retardant is about 5 to about 50 parts by weight.

9. The halogen-free resin composition of claim 1 wherein the phosphorus-containing flame retardant is any one of tri(2,6-dimethylphenyl)phosphine, 10-(2,5-dihydroxyphenyl)-9,10-dihydro-9-oxa-10-phosphaphenanthrene-10-oxide, 2,6-bis(2,6-dimethylphenyl) phosphinobenzene or 10-phenyl-9,10-dihydro-9-oxa-10-phosphaphenanthrene-10-oxide, phenoxy phosphazene compound, phosphate or polyphosphate, or a mixture of at least two or more thereof.

10. The halogen-free resin composition of claim 1, wherein the halogen-free resin composition also comprises a curing accelerator, and based on 100 parts by weight of the total addition amount of component (A), component (B), component (C) and component (D), the addition amount of the curing accelerator is about 0.05 to about 1 parts by weight.

11. The halogen-free resin composition of claim 10, wherein the curing accelerator is any one selected from the group consisting of imidazole or/and pyridine curing accelerators, or a mixture of at least two or more thereof; preferably any one selected from the group consisting of 2-methyl imidazole, 2-ethyl-4-methyl imidazole, 2-phenyl imidazole, 2-undecyl imidazole, triethylamine, benzyl dimethylamine or dimethylamino pyridine, or a mixture of at least two or more thereof.

12. The halogen-free resin composition of claim 1, wherein the halogen-free resin composition also comprises a filler, and the filler is an organic filler, inorganic filler, or both.

13. The halogen-free resin composition of claim 12, wherein based on 100 parts by weight of the total addition amount of component (A), component (B), component (C) and component (D), the addition amount of the filler is about 0 to about 100 parts by weight excluding 0.

14. The halogen-free resin composition of claim 12, wherein the inorganic filler is any one selected from the group consisting of fused silicon dioxide, crystalline silicon dioxide, spherical silicon dioxide, hollow silicon dioxide, aluminum hydroxide, alumina, talcum powder, aluminum nitride, boron nitride, silicon carbide, barium sulfate, barium titanate, strontium titanate, calcium carbonate, calcium silicate, mica or glass fiber powder, or mixture of at least two or more thereof.

15. The halogen-free resin composition of claim 12, wherein, the organic filler is any one selected from the group consisting of polytetrafluorethylene powder, polyphenylene sulfide or polyethersulfone powder, or a mixture of at least two or more thereof.

16. The halogen-free resin composition of claim 12, wherein the filler is silicon dioxide, and the median of the particle diameter thereof is about 1 to about 15 μm.

17. A prepreg, comprising a reinforcing material and the halogen-free resin composition of claim 1 which is attached on the reinforcing material after impregnation and drying.

18. A laminate, wherein it comprises at least one sheet of the prepreg of claim 17.

19. The halogen-free resin composition of claim 10, characterized in that, the curing accelerator is any one selected from the group consisting of 2-methyl imidazole, 2-ethyl-4-methyl imidazole, 2-phenyl imidazole, 2-undecyl imidazole, triethylamine, benzyl dimethylamine or dimethylamino pyridine, or a mixture of at least two or more thereof.

\* \* \* \* \*